United States Patent
Hanrahan et al.

(10) Patent No.: US 6,392,912 B1
(45) Date of Patent: May 21, 2002

(54) LOADING DATA PLANE ON RECONFIGURABLE CHIP

(75) Inventors: Shaila Hanrahan, San Jose; Simon Guo, Santa Clara, both of CA (US)

(73) Assignee: Chameleon Systems, Inc., San Jose, CA (US)

( * ) Notice: Subject to any disclaimer, the term of this patent is extended or adjusted under 35 U.S.C. 154(b) by 0 days.

(21) Appl. No.: 09/758,940

(22) Filed: Jan. 10, 2001

(51) Int. Cl.[7] ................................. G11C 5/06
(52) U.S. Cl. ................ 365/63; 365/189.12; 365/240
(58) Field of Search ....................... 365/63, 189.11, 365/240, 189.08, 189.02, 191, 189.12

(56) References Cited

U.S. PATENT DOCUMENTS 5,781,492 A * 7/1998 Gittinger et al. ....... 365/230.01
5,805,834 A * 9/1998 McKinley et al. ........... 395/283
6,288,566 B1 * 9/2001 Hanrahan et al. ............. 326/38

* cited by examiner

Primary Examiner—David Nelms
Assistant Examiner—Thong Le
(74) Attorney, Agent, or Firm—Burns, Doane Swecker & Mathis LLP

(57) ABSTRACT

A reconfigurable chip includes data registers which can be loaded from off-chip or on-chip. The data register comprises a register block produced from a number of register block units. The register bock units include an active plane store storing the current value of the register bit, at least one off-chip data background store storing a data bit which can be loaded from off-chip, and at least one on-chip data background store storing a value which can be loaded from on-chip.

7 Claims, 3 Drawing Sheets

LOADING DATA PLANE ON RECONFIGURABLE CHIP

BACKGROUND OF THE INVENTION

The present invention relates to devices used on reconfigurable chips for loading data or configuration. Reconfigurable chips typically load data and configuration from an off-chip memory. Especially when reconfigurable chips are used for reconfigurable computing, the loading of the data and configuration from the off-chip memory can take a significant amount of time, slowing the operation of the reconfigurable chip.

It is desired to have an improved loading plane for use on a reconfigurable chip.

SUMMARY OF THE PRESENT INVENTION

One embodiment of the present invention comprises a loading plane which includes a number of background bit storage units associated with foreground bit storage units. At least one of the background units receives a data bit from off-chip memory. This unit can selectively supply the background data bit to a foreground unit. Additionally, at least one additional background unit receives a data bit from an on-chip source, the additional background unit also adapted to selectively supply the background data bit to the foreground unit.

In this way, both data from off-chip and data derived on-chip can be provided to the foreground unit. In a preferred embodiment, the above units are combined into a register block. This register block is preferably within a data path unit. By having background units, the system can operate on the current data loaded in the foreground, while still loading data for the next operation into the background. By having an additional background unit able to load from on-chip, additional flexibility is gained in the operation of the reconfigurable chip.

DETAILED DESCRIPTION OF THE PREFERRED EMBODIMENT

Figure 1:
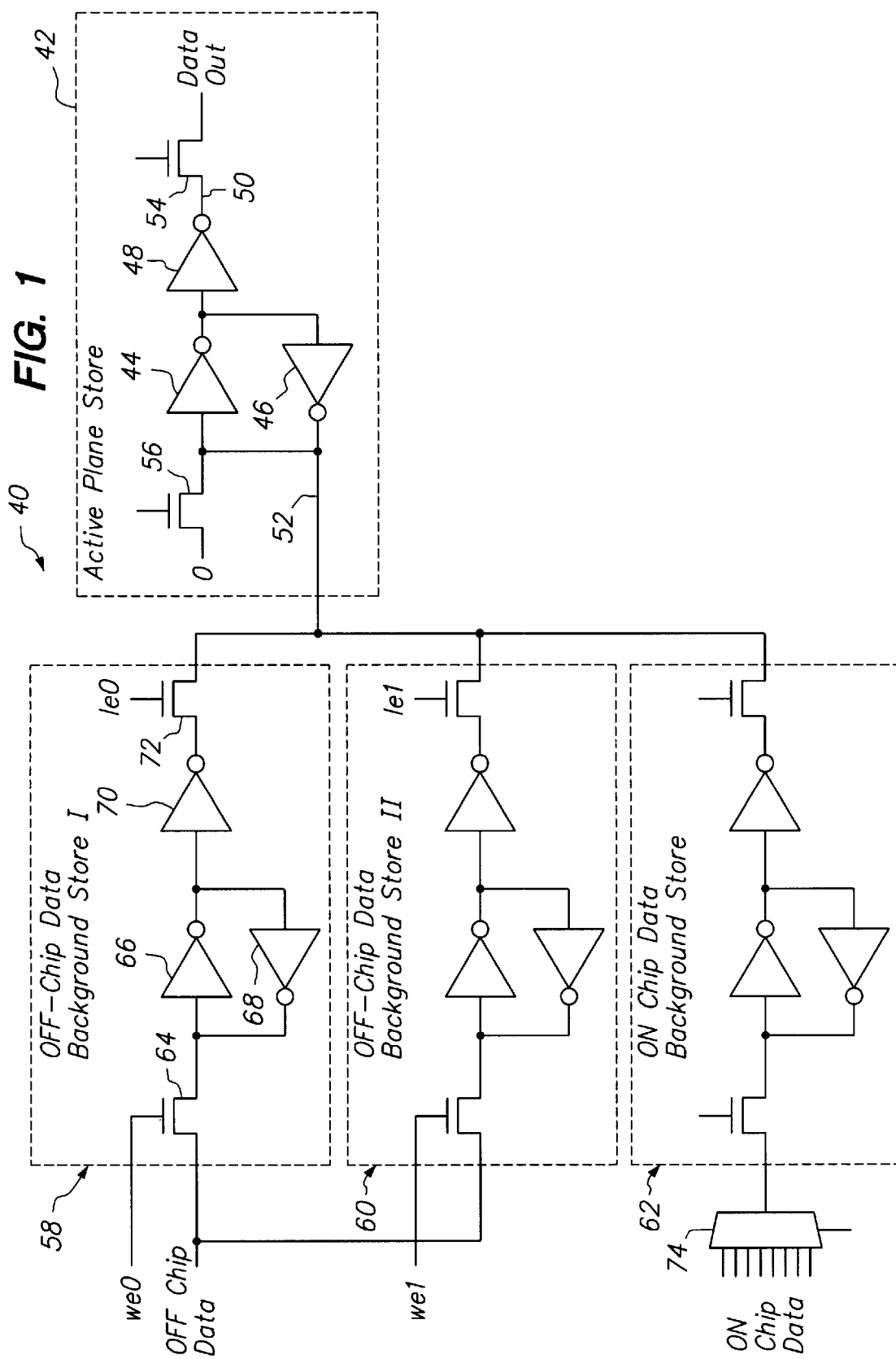
FIG. 1 is a diagram of a loading plane bit element for one embodiment of the present invention.

FIG. 1 shows a register block unit 40 for one bit of the data block. An active plane store 42 stores one bit of data. The bit is maintained by inverter pairs 44 and 46. Inverter 48 keeps the value at point 50 the same as point 52. Switch 54, when turned on, outputs the data bit value. Switch 56, when turned on, zero's the bit in the active plane store 42. This allows for quick resetting of the chip without requiring a zero value to be loaded from off-chip. In addition to the active plane store, a number of background chip data stores are used. This diagram shows two off-chip data background stores 58 and 60, as well as one on-chip background data store 62. The use of the off-chip data background stores allows for data to be received from buses from off-chip and stored on the chip. While the bit from the active plane store 42 is being used, data can be loaded into a background store. Thus, the operation of the system need not stall for data loads. This can significantly increase the speed of the chip. The embodiment of FIG. 1 shows the use of two different off-chip backgrounds units. This further improves the ability to load data in the background.

In this embodiment, the off-chip data background store includes a Write Enable switch 64, a pair of inverters 66 and 68 to store a data bit, and an inverter 70. Switch 72 allows data from the off-chip data background store 58 to go to the active plane store 42. The off-chip data background store 62 is arranged in a similar fashion. The on-chip data preferably is loaded from an on-chip data MUX 74. The on-chip data can include data from data path units and/or constant values. The advantage of maintaining constant values on-chip is that these constant values need not be loaded from off-chip. Thus, if a number of the register block units are arranged in a register block, a constant can be loaded into a register without loading the data from the value from off-chip. this can speed the operation of the reconfigurable chip.

Figure 2:
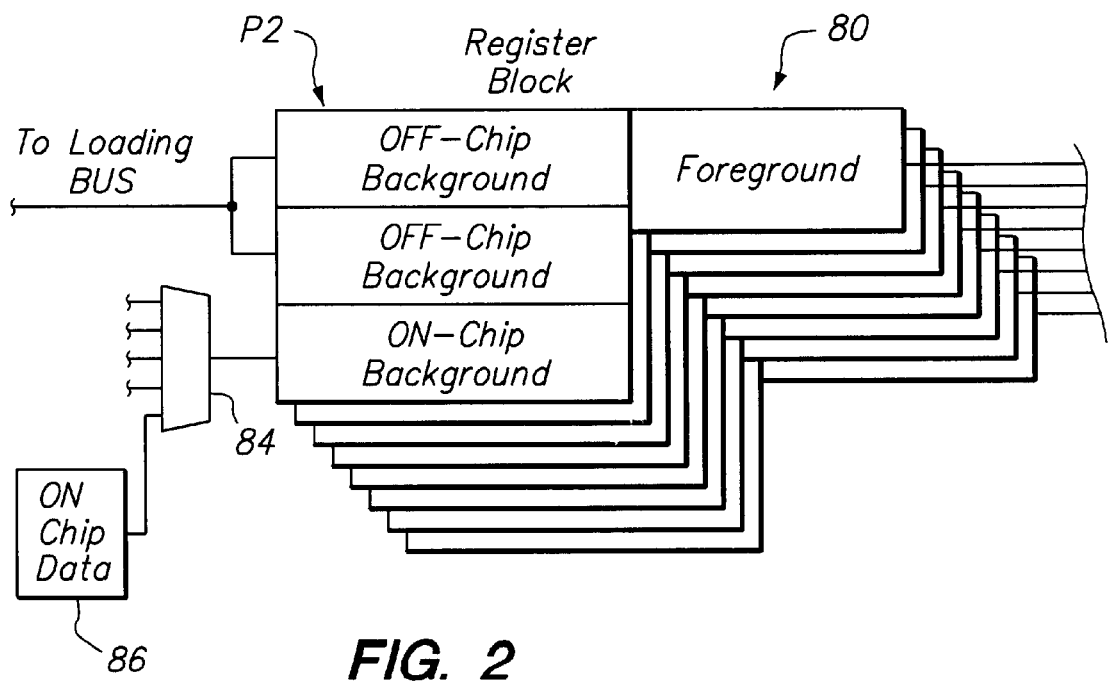
FIG. 2 is a diagram which illustrates the loading plane bit element of FIG. 1, combined into a register block.

FIG. 2 illustrates a register block 80 constructed of a number of register block units 82. In this embodiment each register block unit includes off-chip background units, on-chip background units and a foreground plane store. Each register block unit is connected to the loading bus for the off-chip background units and multiplexer 84 for the on-chip background units. The multiplexer 84 is connected to units such as unit 86 on-chip which could be for example a data path unit. FIG. 2 illustrates how the elements shown in FIG. 1 can be arranged to form a register. This register can have two values stored in the background from off-chip, and one value stored in the background from on the chip, as well as a foreground register value.

Figure 3:
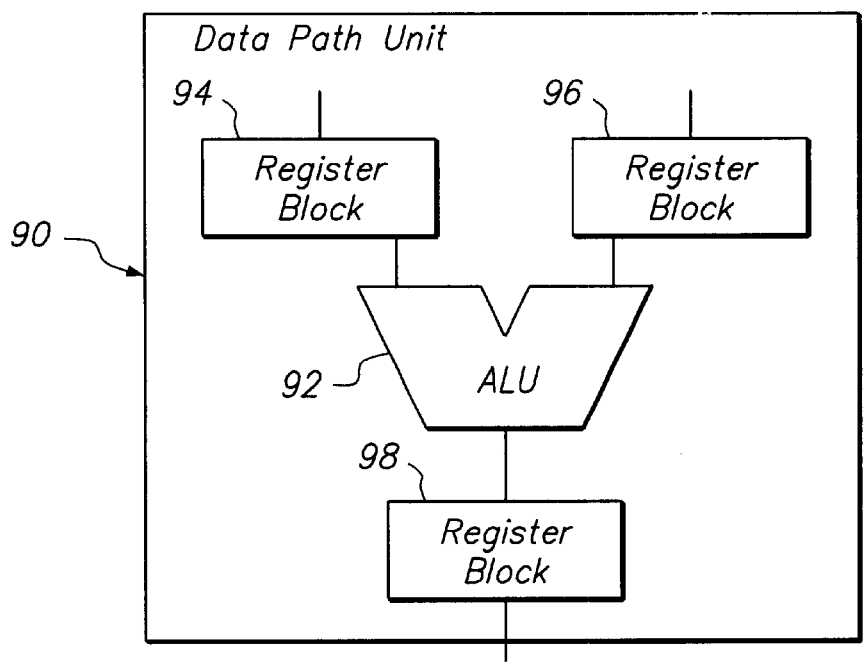
FIG. 3 is an illustration of a data path unit using the register block of FIG. 2.

Register blocks shown in FIG. 2 can be arranged as shown in FIG. 3 within a data path unit 90. As shown in this example, the values sent to the ALU 92 can be from the register blocks 94 and 96. The values in the register blocks 94 and 96 in the foreground can be loaded from off the chip or on the chip, as shown in FIG. 2. In one preferred embodiment, the output of the ALU 92 is sent to another register block 98. This can be for example a connection to the on-chip background units, as shown in FIG. 2. A description of one example of a data path unit is given in the patent application for "A High Performance Data Path Unit for Behavioral Data Transmission and Reception," by inventor H. Wang, filed May 7, 1999, Ser. No. 09/307,072, incorporated herein by reference.

Figure 4:
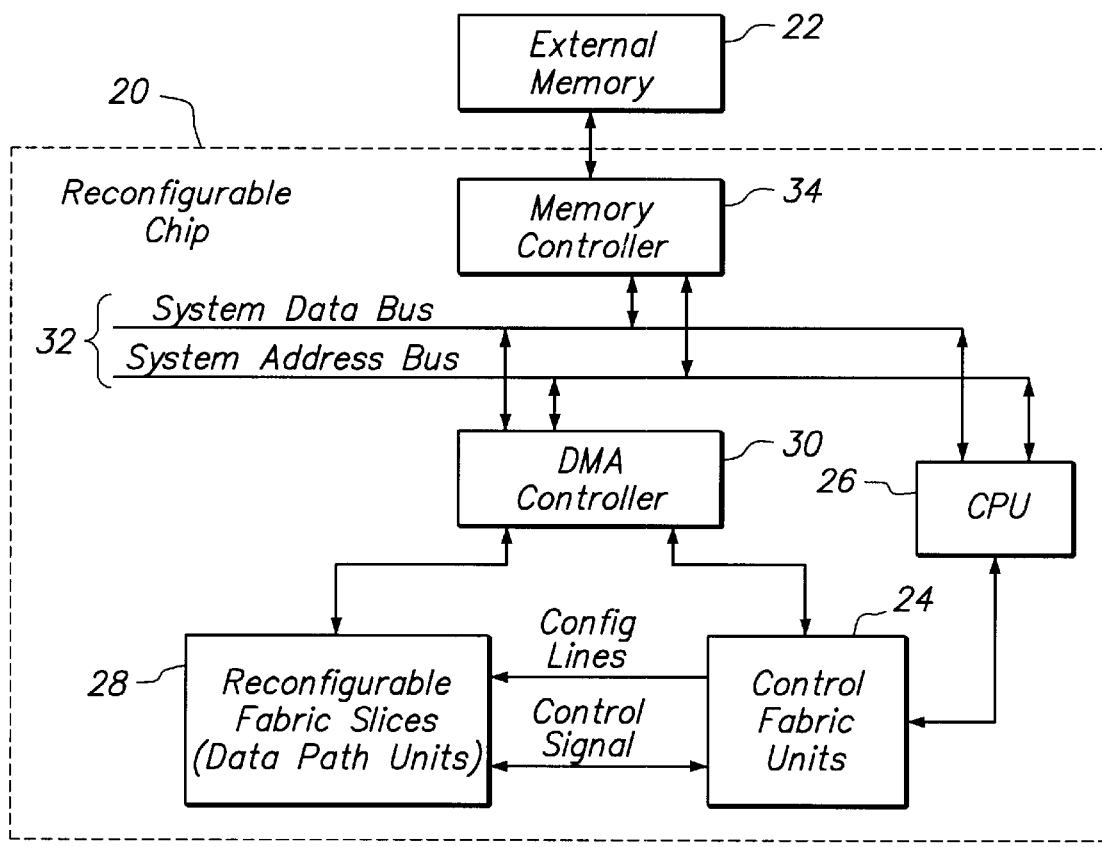
FIG. 4 is a diagram of a reconfigurable chip using the data path units of FIG. 3.

FIG. 4 illustrates a reconfigurable chip 22 connected to an external memory. Data is sent from the external memory 22 to a memory controller 34 across bus 32 to direct memory access (DMA) controller 30 which loads the data into the reconfigurable fabric slices. The reconfigurable slices include the data path units shown in FIG. 3. In this way, all chip data can be loaded from the external memory 22. Also shown in FIG. 4 are the control fabric units 24 which arrange the control of the reconfigurable chip 20. The data for the control portion is typically loaded from off-chip as well, but need not use on-chip background units.

It will be appreciated by those of ordinary skill in the art that the invention can be implemented in other specific forms without departing from the spirit or character thereof. The presently disclosed embodiments are therefore considered in all respects to be illustrative and not restrictive. The scope of the invention is illustrated by the appended claims rather than the foregoing description, and all changes that come within the meaning and range of equivalents thereof are intended to be embraced herein.

What is claimed is:

1. A reconfigurable chip comprising:

a foreground unit adapted to store a foreground data bit, the foreground unit operably connected to provide a data bit;

a background unit adapted to store a background data bit, the background unit receiving the background data bit from an off-chip memory, the background unit adapted to selectively supply the background data bit to the foreground unit to be stored as the foreground data bit; and an additional background unit adapted to store an additional background data bit, the additional background unit receiving an additional background data bit from an on-chip source, the additional background unit adapted to selectively supply the additional background data bit to the foreground unit to be stored as the foreground data bit.

2. The reconfigurable chip of claim 1 further comprising a second background unit, the second background unit adapted to receive a second background data bit from the off-chip memory, the second background unit adapted to selectively supply the second background data bit to the foreground unit to be stored as the foreground data bit.

3. The reconfigurable chip of claim 1 wherein the foreground unit; at the background unit; and the additional background unit comprise a register block unit, and wherein multiple register block units combine to form a register block.

4. The reconfigurable chip of claim 3 wherein the register block is provided within a data path unit so that the input registers of the data path unit can have data loaded from off-chip or on-chip.

5. The reconfigurable chip of claim 1 wherein the additional background unit is associated with a multiplexer which provides the additional background data bit from a number of different sources.

6. The reconfigurable chip of claim 2 wherein the at least two background units are connected to the same input data line.

7. The reconfigurable chip of claim 1 wherein the foreground unit includes a switch connected to a clear value to allow the bit within the foreground unit to be cleared without loading data from the off-chip memory.

* * * * *